United States Patent [19]

Okanobu

[11] Patent Number: 4,703,292
[45] Date of Patent: Oct. 27, 1987

[54] TUNING CIRCUIT APPARATUS

[75] Inventor: Taiwa Okanobu, Tokyo, Japan

[73] Assignee: Sony Corporation, Tokyo, Japan

[21] Appl. No.: 831,518

[22] Filed: Feb. 21, 1986

[30] Foreign Application Priority Data

Mar. 4, 1985 [JP] Japan .................................. 60-042380
Jun. 13, 1985 [JP] Japan .................................. 60-128480

[51] Int. Cl.$^4$ .............................................. H03J 3/18
[52] U.S. Cl. ........................................ 334/15; 455/179
[58] Field of Search .................... 334/15; 455/179; 331/36 C, 177 V; 357/14

[56] References Cited

U.S. PATENT DOCUMENTS 3,866,138  2/1975  Putzer .................................. 334/15 X
4,291,290  9/1981  Ijichi et al. .......................... 334/15 X Primary Examiner—Paul Gensler
Attorney, Agent, or Firm—Lewis H. Eslinger; Alvin Sinderbrand

[57] ABSTRACT

In a tuning circuit apparatus comprising first and second tuning circuits having their tuning frequencies varied in a ganged fashion; a composite varactor device provides first and second Varicap diodes formed on a common semiconductor substrate, with anodes of the first and second Varicap diodes being led out to respective independent terminals and cathodes of the Varicap diodes being led out to a common terminal, first and second tuning coils are connected at first ends thereof to the independent terminals associated with the first and second Varicap diodes, respectively, first and second by-pass capacitors are respectively connected between second ends of the first and second tuning coils and the common terminal of the composite varactor device, and a control voltage supplying source parallelly supplies a control voltage to the first and second Varicap diodes.

7 Claims, 8 Drawing Figures

TUNING CIRCUIT APPARATUS

BACKGROUND OF THE INVENTION

1. Field of the Invention

This invention relates generally to tuning circuits, and is particularly directed to a tuning circuit apparatus which uses a composite varactor device.

2. Description of the Prior Art

In a prior art superheterodyne receiver shown on FIG. 1, and which uses Varicap diodes (PN semiconductor diodes whose capacitance varies with the applied voltage) or varactor diodes as tuning elements, a so-called bar-type antenna coil L1, a Varicap diode D1 and a by-pass capacitor C1 constitute an antenna tuning circuit 1. The tuning output from antenna tuning circuit 1 is supplied to a mixer circuit 3. A coil L2, a Varicap diode D2 and a by-pass capacitor C2 constitute a resonance circuit 2 for a local oscillation circuit 4. The local oscillation signal from local oscillation circuit 4 is supplied to mixer circuit 3. A channel-selection or control voltage Vc is supplied from a variable bias voltage source 5 through decoupling resistors R1 and R2 to Varicap diodes D1 and D2 so that the capacities of Varicap diodes D1 and D2 are controlled and the receiving frequency is varied.

On the other hand, in an autodyne (straight) receiver or a superheterodyne receiver in which a high frequency amplifier is provided at the input stage, the input stage thereof is constructed, for example, as shown in FIG. 2. More particularly, in FIG. 2, coil L1, Varicap diode D1 and capacitor C1 constitute an antenna tuning circuit 1A and coil L2, Varicap diode D2 and capacitor C2 constitute an interstage tuning circuit 2A. The tuning output from tuning circuit 1A is supplied through a high frequency amplifier 6 to the tuning circuit 2A in which it is further selected and then delivered. A channel selection voltage Vc is supplied through resistors R1 and R2 to Varicap diodes D1 and D2 from the variable bias voltage source 5.

When the plurality of tuning circuits 1 and 2 or 1A and 2A are provided as described above, it is necessary that the tuning circuits 1 and 2 or 1A and 2A be separated, as to high frequencies, from each other by by-pass capacitors C1 and C2 and decoupling resistors R1 and R2, and thereby prevented from interfering with each other.

It is further known to provide a composite varactor device $D_W$ which, as shown in FIG. 3, incorporates a plurality of Varicap diodes, for example, two Varicap diodes D1 and D2, formed on a common semiconductor substrate, for example, on the same semiconductor chip CP. In this case, the anode electrodes of diodes D1 and D2 are independently let out therefrom to terminals A1 and A2, respectively, while the cathode electrodes of diodes D1 and D2 are led out therefrom to a common terminal K. In such composite varactor device $D_W$, since Varicap diodes D1 and D2 are formed adjacent to each other on the same semiconductor chip CP, the characteristics of the Varicap diodes D1 and D2 can be made equal to each other. Thus, it is possible to avoid the troublesome work of testing individually formed Varicap diodes and ranking the same according to their characteristics, so that Varicap diodes having similar characteristics can be selected and then used together in the tuning circuits of FIGS. 1 and 2. Moreover, the manufacturing cost of the composite varactor device can be advantageously reduced as compared with the cost of the individual Varicap diodes.

However, when the composite varactor device $D_W$ is used in the tuning circuits 1 and 2 or 1A and 2A shown in FIGS. 1 and 2, trouble may occur. More specifically, when the composite varactor device $D_W$ is to be used in the tuning circuits 1 and 2 or 1A and 2A of FIG. 1 or FIG. 2, the circuit configuration shown in FIG. 4 may be considered therefor. In such case, coils L1 and L2 are connected between the anode terminals A1 and A2, respectively, of Varicap diodes D1 and D2 and the ground, a by-pass capacitor C3 is connected between terminal K and the ground and a resistor R3 and a variable bias voltage source 5 are connected in series to the connection point between terminal K and by-pass capacitor C3. In the composite varactor device $D_W$, the impedances of Varicap diodes D1 and D2, when terminal K is viewed from the cathode electrodes of Varicap diodes D1 and D2, can be made so small that interference can be prevented from occurring between Varicap diodes $D_1$ and $D_2$.

However, with the circuit arrangement shown in FIG. 4, a resonance current $I_1$ of tuning circuit 1B flows through by-pass capacitor C3 and a resonance current $I_2$ of tuning circuit 2B also flows through by-pass capacitor C3 so that, if by-pass capacitor C3 has significant impedance, interference occurs between tuning circuits 1B and 2B. Accordingly, the impedance of by-pass capacitor C3 must be made sufficiently small. This requires that the capacity of by-pass capacitor C3 be substantially large and also that the equivalent series resistance be made sufficiently small. In this case, however, when the receiving frequency is low, for example, within the medium wave band, it is difficult to completely satisfy the foregoing requirements with the result that interference occurs between tuning circuits 1B and 2B. This causes troubles, for example, in the case of the autodyne receiver, an abnormal oscillation occurs or the operation thereof becomes unstable; while, in the case of the superheterodyne receiver, the local oscillation signal is radiated through the tuning circuit 1B to the outside.

Moreover, if the capacity of the by-pass capacitor C3 in the circuit of FIG. 4 is increased, the time constant determined by capacitor C3 and resistor R3 becomes large so that changes of the Varicap diodes D1 and D2 are delayed relative to the corresponding changes in the channel selection voltage Vc. As a result, the responsiveness of the tuning operation becomes poor or sluggish.

OBJECTS AND SUMMARY OF THE INVENTION

Accordingly, it is an object of the present invention to provide an improved tuning circuit apparatus which can avoid the above-mentioned problems encountered with the prior art apparatus.

More specifically, it is an object of the present invention to provide an improved tuning circuit apparatus which can prevent the occurrence of interference among a plurality of tuning circuits.

It is another object of the present invention to provide an improved tuning circuit apparatus which can, even when the receiving frequency lies in a medium wave band, avoid abnormal oscillation, unstable operation, the radiation of the local oscillation signal to the outside and other similar problems.

It is still another object of the present invention to provide an improved tuning circuit apparatus, as aforesaid, which can fully utilize the excellent characteristics of a composite varactor diode.

It is a further object of the present invention to provide an improved tuning circuit apparatus, as aforesaid, which can be simplified in construction and manufactured at low cost.

According to an aspect of the present invention, a tuning circuit apparatus containing a plurality of tuning circuits having their tuning frequencies varied in a ganged fashion, comprises: a composite varactor device having a plurality of Varicap diodes formed on a common semiconductor substrate, with first electrodes of the Varicap diodes being led out to respective independent terminals while second electrodes of the Varicap diodes are both led out to a common terminal; a plurality of tuning coils connected at first ends thereof to the independent terminals, respectively, associated with the plurality of Varicap diodes; a plurality of capacitors respectively connected between second ends of the plurality of tuning coils and the common terminal of the composite varactor device; and control voltage means for parallelly supplying a control voltage to the plurality of Varicap diodes.

The above, and other objects, features and advantages of the present invention, will become apparent from the following detailed description of preferred embodiments thereof which is to be read in conjunction with the accompanying drawings in which the same reference numerals are used to designate like elements and parts in the several views.

DESCRIPTION OF THE PREFERRED EMBODIMENTS

Figure 1:
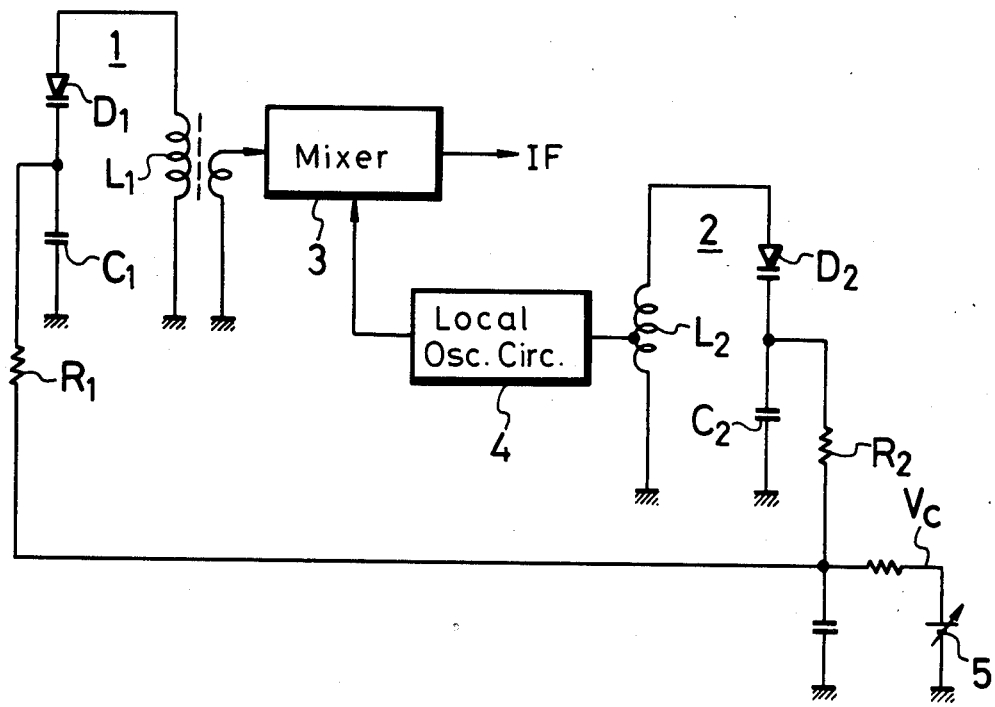
FIG. 1 is a connection diagram showing a prior art tuning circuit and input stage of a superheterodyne receiver.
Figure 2:
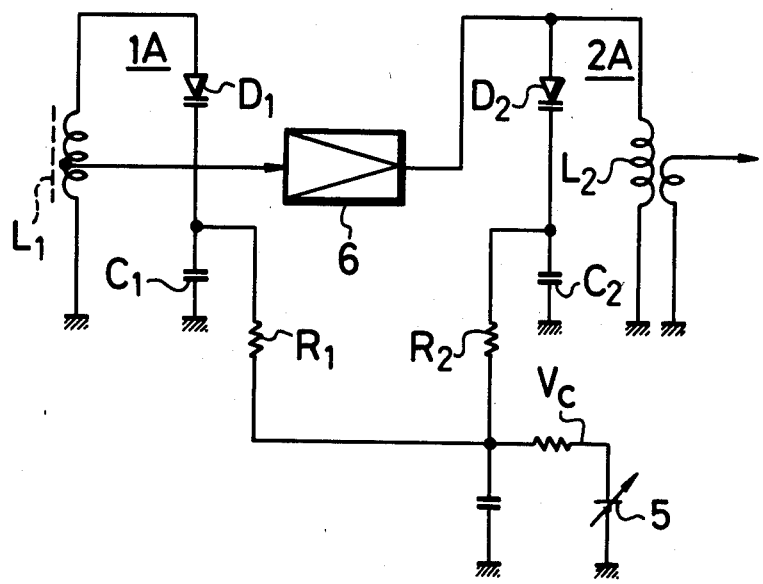
FIG. 2 is a connection diagram showing a prior art input stage of a superheterodyne receiver provided with a high frequency amplifier.
Figure 3:
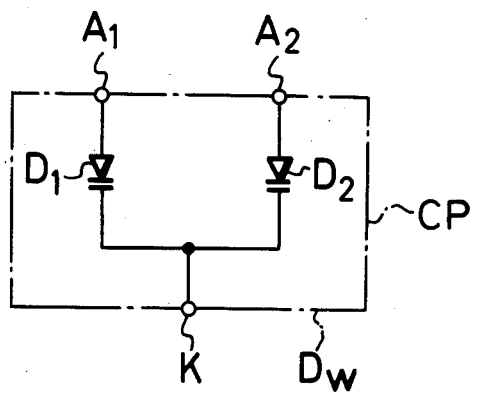
FIG. 3 is a connection diagram of a known composite varactor device incorporating two Varicap diodes.
Figure 4:
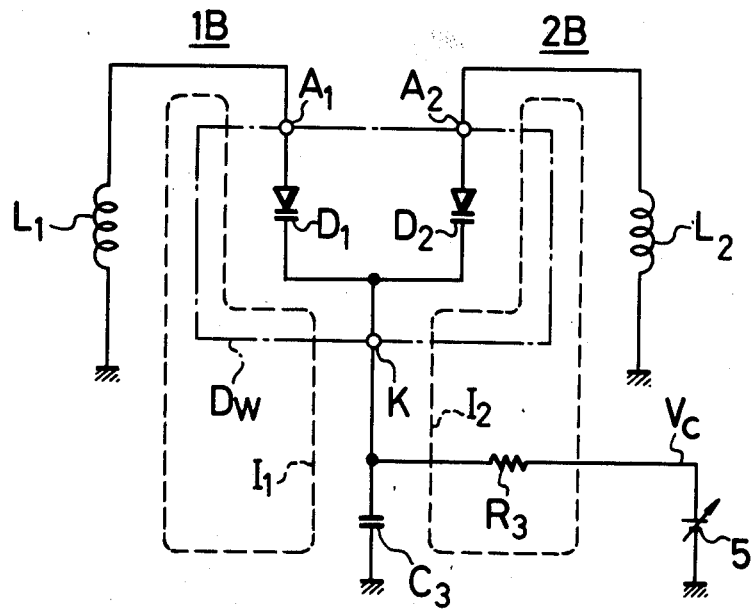
FIG. 4 is a connection diagram to which reference is made in explaining a problem to be overcome by the present invention.
Figure 5:
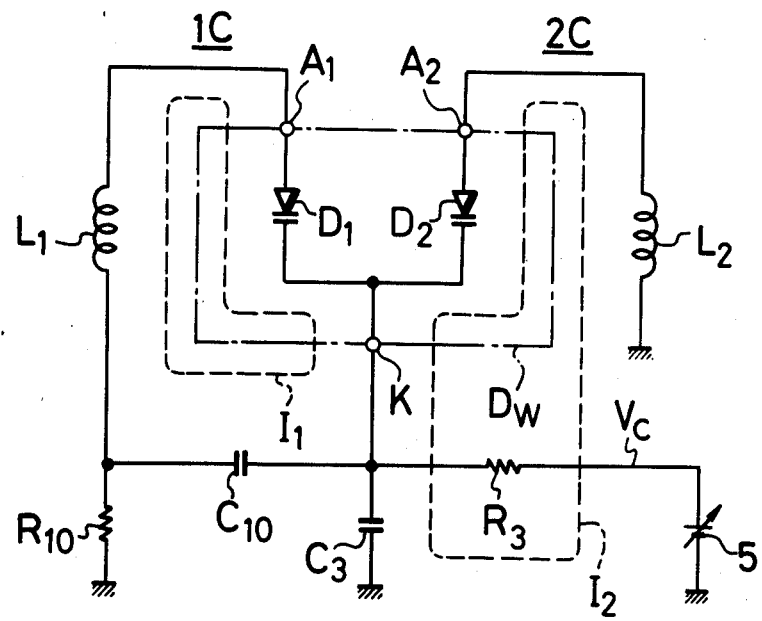
FIG. 5 is a connection diagram showing a main part of a first embodiment of a tuning circuit apparatus according to the present invention.

The first embodiment of the present invention will now be described in detail with reference to FIG. 5, in which parts corresponding to those described in FIG. 4 are identified by the same references and will not be further described in detail herein. The tuning circuit apparatus shown in FIG. 5 is particularly used for an AM receiver. Between the anode terminal A1 of the composite varactor device $D_W$ and the ground, there are connected in series bar-type antenna coil L1 and a decoupling resistor R10. Further, between the connection point of coil L1 and resistor R10 and the cathode or common terminal K of composite varactor device $D_W$, there is connected a by-pass capacitor C10 to complete the antenna tuning circuit 1C.

On the other hand, between anode terminal A2 of the composite varactor device $D_W$ and the ground, there is connected the local oscillation coil or interstage coil L2. Further, between the cathode or common terminal K and the ground, there is connected the by-pass capacitor C3, similarly to FIG. 4, for completing the resonance circuit for the local oscillation circuit or interstage tuning circuit 2C.

Further, in the embodiment of FIG. 5, the channel selection voltage (control voltage) Vc from variable bias voltage source 5 is supplied through decoupling resistor R3 to the cathode terminal K of composite varactor device $D_W$. The resistance value of resistor R10 is selected so that the impedance thereof is sufficiently large as compared with that of by-pass capacitor C10. Furthermore, the capacity of by-pass capacitor C10 is selected to have a sufficiently large value, for example, more than twice the maximum value of the capacity Cv of Varicap diode D1 for the usable frequency range.

In the circuit arrangement of FIG. 5, since coil L1 and Varicap diode D1 are connected in parallel to each other through by-pass capacitor C10, these circuit elements L1 and D1 act as the tuning circuit 1C. Also, since coil L2 and Varicap diode D2 are connected in parallel to each other via by-pass capacitor C3, these circuit elements L2 and D2 act as the tuning circuit 2C.

The channel selection voltage Vc is applied to Varicap diode D1 through the loop formed from variable bias voltage source 5 through resistor R3, Varicap diode D1, coil L1 and resistor R10 back to variable bias voltage source 5. The channel selection voltage Vc is also supplied to Varicap diode D2 through the loop formed from variable bias voltage source 5 through resistor R3, Varicap diode D2 and coil L2 back to the variable bias voltage source 5.

Accordingly, the tuning frequencies of tuning circuits 1C and 2C are varied in accordance with channel selection voltage Vc in a ganged fashion.

In the embodiment of FIG. 5, since the resonance current $I_1$ of tuning circuit 1C flows through the loop formed of circuit elements L1,D1 and C10, while the resonance current $I_2$ of tuning circuit 2C flows through the loop formed of circuit elements L2,D2 and C3, the current $I_1$ can be prevented from flowing through by-pass capacitor C3 and the current $I_2$ can be prevented from flowing through by-pass capacitor C10. Accordingly, even when by-pass capacitors C10 and C3 have small impedances, interference between tuning circuits 1C and 2C can be prevented. Also, even when the receiving frequency lies in the medium wave band, the tuning circuit apparatus does not cause any abnormal oscillation and its unstable operation can be prevented. In addition, the described tuning circuit apparatus according to the invention is seen to be very simple in construction.

A second embodiment of the tuning circuit apparatus according to the present invention will now be described with reference to FIG. 6, in which parts corresponding to those shown on FIG. 5 are identified by the same references and will not be described in detail.

Figure 6:
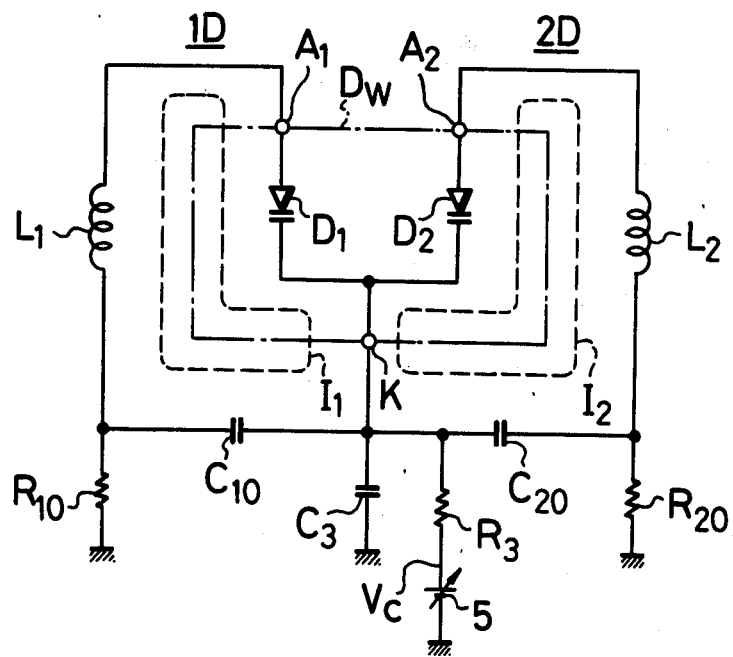
FIG. 6 is a connection diagram similar to that of FIG. 5, but showing a second embodiment of the present invention.

In the embodiment shown in FIG. 6, a capacitor C20 and a resistor R20 are added to the circuit arrangement of FIG. 5, with the circuit elements L2,D2,C20 and R20 being connected in the same way as the circuit elements L1,D1,C10 and R10. Further, by-pass capacitor C3 is connected between the common cathode terminal K and the ground.

In the circuit arrangement thus constructed, since coil L1 and Varicap diode D1 are connected in parallel to each other through by-pass capacitor C10, these circuit elements L1 and D1 act as the tuning circuit 1D. On the other hand, since coil L2 and Varicap diode D2 are coupled in parallel to each other via by-pass capacitor C20, these circuit elements L2 and D2 act as the tuning circuit 2D. In the circuit of FIG. 6, the resistors R10 and R20 are selected to have sufficiently large impedances as compared with those of by-pass capacitors C10 and C20. Further, the capacities of by-pass capacitors C10 and C20 are selected to be sufficiently larger than twice the maximum capacities of the Varicap diodes D1 and D2 for the usable frequency range.

In this embodiment, channel selection voltage Vc is applied to Varicap diode D1 through the loop formed from variable bias voltage source 5 via resistor R3, Varicap diode D1, coil L1 and resistor R10 back to the variable bias voltage source 5. Similarly, the channel selection voltage Vc is applied to Varicap diode D2 through the loop formed from variable bias voltage source 5 via resistor R3, Varicap diode D2, coil L2 and resistor R20 back to the variable bias voltage source 5. Accordingly, the tuning frequencies of tuning circuits 1D and 2D are varied in accordance with the channel selection voltage Vc in a ganged fashion.

In the embodiment of FIG. 6, since the resonance current $I_1$ of tuning circuit 1D flows through the loop formed of the circuit elements L1,D1 and C10, and the resonance current $I_2$ of the tuning circuit 2D flows through the loop formed of the circuit elements L2,D2 and C20, flow of the resonance current $I_1$ through the by-pass capacitor C20 can be prevented, and flow of the resonance current $I_2$ through the by-pass capacitor C10 can also be prevented. Accordingly, even when by-pass capacitors C10 and C20 each have a slight impedance, interference can be prevented from occurring between tuning circuits 1D and 2D. Further, the tuning circuit apparatus of FIG. 6 can be prevented from generating an abnormal oscillation and also can be prevented from being operated unstably. In addition, the local oscillation signal can be prevented from being radiated to the outside, and deterioration of the responsiveness of the tuning operation can be prevented.

A third embodiment of a tuning circuit apparatus according to the present invention will now be described with reference to FIG. 7, in which parts corresponding to those shown in FIGS. 5 and 6 are identified by the same references and will not be described in detail.

When each of the Varicap diodes D1 and D2 is provided as a single or independent circuit element, the Varicap diodes D1 and D2 may be physically located in respect to each other to prevent a coupling from being produced between the Varicap diodes D1 and D2. However, in the composite varactor device $D_W$ of FIG. 5 or FIG. 6, Varicap diodes D1 and D2 are formed on the same semiconductor substrate in a relatively close relation to each other, so that a stray capacity is generated between the anodes of Varicap diodes D1 and D2, namely, between the terminals A1 and A2. Accordingly, since the resonance voltage generated in tuning circuit 2C or 2D is leaked through this stray capacity to the tuning circuit 1C or 1D troubles, such as, abnormal oscillation, unstable operation, radiation of the local oscillation signal to the outside and the like may occur.

Figure 7:
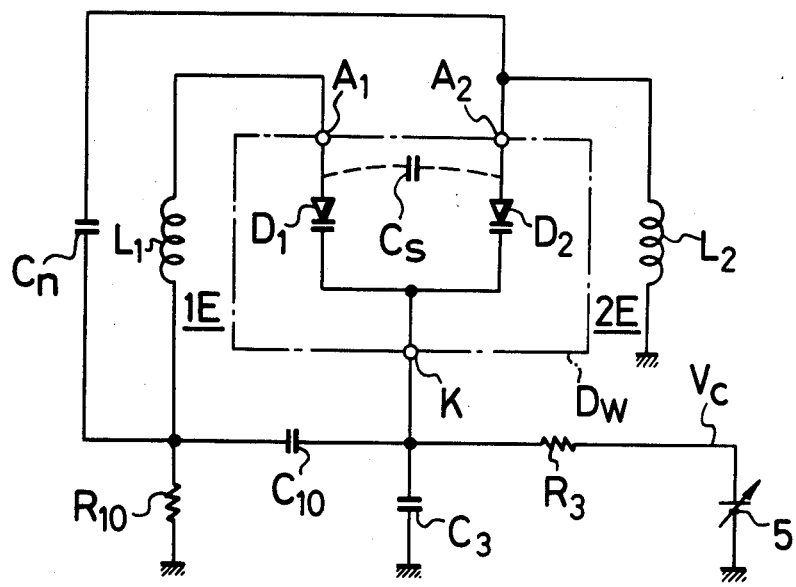
FIG. 7 is another connection diagram similar to that of FIG. 5, but showing a third embodiment of the present invention.

The third embodiment of the invention shown in FIG. 7 is intended to solve the above-mentioned problems.

Referring to FIG. 7, the tuning circuits 1E and 2E are constructed in the same way as was described in connection with, for example, FIG. 5. Further, in FIG. 7, reference letter Cs designates a stray capacity generated between Varicap diodes D1 and D2, and a neutralizing capacitor Cn is connected between a common connection point amongst the elements L1, C10 and R10 and the terminal A2. In this embodiment, the following equality is established:

$$Cn = C10 \cdot Cs/Cv \qquad (i)$$

where Cv is the capacity off Varicap diode D1.

Figure 8:
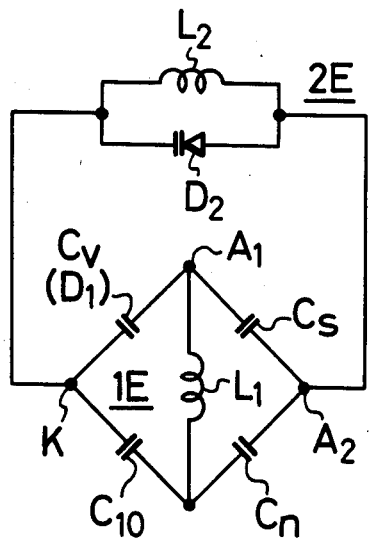
FIG. 8 is a diagram showing an equivalent of the circuit of FIG. 7, and to which reference will be made in explaining the operation of the latter.

The circuit arrangement described above with reference to FIG. 7 is equivalent to the bridge circuit shown in FIG. 8. Such bridge circuit is balanced on the basis of Eq.(i), so that the resonance voltage generated in tuning circuit 2E can be prevented from appearing across coil L1. In other words, the resonance voltage generated in tuning circuit 2E is prevented from being leaked through stray capacity Cs to tuning circuit 1E. Accordingly, it is possible to avoid the troubles, such as abnormal oscillation, unstable operation, radiation of the local oscillation signal and the like, that would otherwise result from the stray capacity in the composite varactor device $D_W$.

In order that the bridge circuit in FIG. 8 may be balanced completely, it is necessary to vary the capacity of neutralizing capacitor Cn in accordance with changes in the capacity Cv of Varicap diode D1, that is, in accordance with changes in the receiving frequency. In practice, the smaller the capacity Cv becomes, the larger is the influence of the stray capacity Cs. Thus, it is sufficient to select the capacity of neutralizing capacitor Cn so as to satisfy Eq.(i) near to the region in which the capacity Cv of the Varicap diode D1 is minimized.

For example, when the receiving band is determined, such as, the medium wave band, the range of the capacity Cv of Varicap diode D1 is selected to be from 500 pF to 30 pF, the stray capacity Cs is selected to be in a range from 30 mpF to 50 mpF and a discrete capacitor is externally connected to make the minimum value of the capacity (combined capacity) Cv equal to 45 pF. Since the capacity of capacitor C10 must be sufficiently larger than the Capacity Cv, it is selected to be 6800 pF. Then, Eq.(i) yields:

$$Cn = 6800 \times 30 \times 10/45 pF$$

$$\simeq 4.5 pF \text{ (when } Cs \text{ is equal to } 30 mpF\text{)}$$

$$Cn \simeq 7.6 pF \text{ (when } Cs \text{ is equal to } 50 mpF\text{)}$$

thus, the stray capacity Cs can be cancelled out by a neutralizing capacitor Cn of relatively small capacity.

Therefore, in accordance with the present invention as set forth above, even when the composite varactor device $D_W$ is employed, it is possible to reduce the influence of the stray capacity Cs and also to remove the troubles, such as abnormal oscillation, unstable operation, radiation of the local oscillation signal and the like, that would otherwise result. Thus, it is possible to effectively utilize the excellent characteristics of the composite varactor device $D_W$. In addition, since it is sufficient that only the neutralizing capacitor Cn be added, the tuning circuit apparatus of the invention can be manufactured at low cost.

It is also to be appreciated that, in the abovedescribed embodiments of this invention, the resistor R3 is not always necessary.

According to this invention as described above, since a first resonance current of a first tuning circuit flows through a first loop formed of a first coil, a first Varicap diode and a first capacitor, while a second resonance current of a second tuning circuit flows through a second loop formed of a second coil, a second Varicap diode and a second capacitor, the first resonance current can be prevented from flowing through the second capacitor, while the second resonance current can be prevented from flowing through the first capacitor. Accordingly, even when the first and second capacitors each have a slight impedance, interference can be prevented from occurring between the first and second tuning circuits.

In addition, according to the present invention, the tuning circuit apparatus can be significantly simplified in construction.

Having described preferred embodiments of the invention, it will be appreciated that the invention is not limited thereto, and that many modifications and variations can be effected therein by one skilled in the art without departing from the spirit or scope of the invention as defined in the appended claims.

What is claimed is:

1. A tuning circuit apparatus having a plurality of tuning circuits whose tuning frequencies are varied in a ganged fashion, comprising:
    a composite varactor device including a plurality of Varicap diodes formed on a common semiconductor substrate and each having first and second electrodes, said first electrodes of said Varicap diodes being led out to independent terminals while said second electrodes of said Varicap diodes are led out to a common terminal;
    a plurality of tuning coils each having first and second ends, said first ends being respectively connected to said independent terminals of said plurality of Varicap diodes;
    a plurality of capacitors respectively having first sides connected directly to said second ends of said tuning coils and second sides connected directly to said common terminal of said composite varactor device; and
    control voltage means for parallelly applying a control voltage to said Varicap diodes.

2. A tuning circuit apparatus having first and second tuning circuits whose tuning frequencies are varied in a ganged fashion, comprising:
    a composite varactor device including first and second Varicap diodes formed on a common semiconductor substrate and each having first and second electrodes, said first electrodes being led out to independent terminals and said second electrodes being led out to a common terminal;
    first and second tuning coils each having first and second ends, said ends being respectively connected to said independent terminals of said first and second Varicap diodes;
    first and second capacitors respectively having first sides connected directly to said second ends of said first and second tuning coils and second sides connected directly to said common terminal of said composite varactor device; and
    control voltage means for parallely applying a control voltage to said first and second Varicap diodes.

3. A tuning circuit apparatus according to claim 2; in which said first electrodes are anodes and said second electrodes are cathodes of said Varicap diodes.

4. A tuning circuit apparatus having first and second circuits whose tuning frequencies are varied in a ganged fashion, comprising:
    a composite varactor device including first and second Varicap diodes formed on a common semiconductor substrate and each having first and second electrodes, said first electrodes being led out to independent terminals and said second electrodes being led out to a common terminal;
    first and second tuning coils each having first and second ends, said first ends being respectively connected to said independent terminals of said first and second Varicap diodes;
    first and second capacitors connected between said second ends of said first and second tuning coils, respectively, and said common terminal of said composite varactor device;
    control voltage means for parallelly applying a control voltage to said first and second Varicap diodes; and
    a neutralizing capacitor connected between a connection point of said first tuning coil to said first capacitor and said independent terminal of said second Varicap diode.

5. A tuning circuit apparatus having first and second circuits whose tuning frequencies are varied in a ganged fashion, comprising:
    a composite varactor device including first and second Varicap diodes formed on a common semiconductor substrate and each having an anode and a cathode, said anodes being led out to independent terminals and said cathodes being led out to a common terminal;
    first and second tuning coils each having first and second ends, said first ends being respectively connected to said independent terminals of said first and second Varicap diodes;
    first and second capacitors connected between said second ends of said first and second tuning coils, respectively, and said common terminal of said composite varactor device; and
    control voltage means for parallelly applying a control voltage to said first and second Varicap diodes;
    said second end of said first tuning coil being further connected to ground through a first decoupling resistor, said second capacitor being connected between said common terminal and ground and said second end of said second coil being connected to ground.

6. A tuning circuit apparatus according to claim 5; in which said control voltage means is connected between ground and said common terminal in series with a second decoupling resistor.

7. A tuning circuit apparatus according to claim 6; further comprising a third capacitor connected between said common terminal and said second end of said second coil, and a third decoupling resistor through which said second ends of said second coil is connected to ground.

* * * * *